United States Patent [19]

Kato

[11] Patent Number: 5,557,571

[45] Date of Patent: Sep. 17, 1996

[54] DYNAMIC RANDOM ACCESS MEMORY WITH INTERNAL TESTING SWITCHES

[75] Inventor: Tetsuo Kato, Itami, Japan

[73] Assignee: Mitsubishi Denki Kabushiki Kaisha, Tokyo, Japan

[21] Appl. No.: 422,411

[22] Filed: Apr. 14, 1995

[30] Foreign Application Priority Data

Nov. 29, 1994 [JP] Japan .................................. 6-294739

[51] Int. Cl.⁶ ..................................................... G11C 7/00
[52] U.S. Cl. ..................................... 365/189.05; 365/201
[58] Field of Search .............................. 365/189.05, 193, 365/201

[56] References Cited

U.S. PATENT DOCUMENTS

| | | | |
|---|---|---|---|
| 4,899,313 | 2/1990 | Kumanoya | 365/201 |
| 5,016,220 | 5/1991 | Yamagata | 365/201 |
| 5,208,778 | 5/1993 | Kumanoya | 365/201 |
| 5,331,596 | 7/1994 | Miyazawa | 365/201 |

Primary Examiner—David C. Nelms
Assistant Examiner—Son Mai
Attorney, Agent, or Firm—Lowe, Price, LeBlanc & Becker

[57] ABSTRACT

In a dynamic random access memory device, first, second and third switches and an internal signal generator therefor are provided besides circuit portions of an ordinary random access memory such as a memory cell. A data input circuit includes data input pins for receiving an input data and data-in-buffers for storing the input data. The first switch can connect one of data input pins to either one of data in buffers or an end of a signal line. The second switch can connect the data-in-buffers to a data output circuit. The third switch can connect the internal voltage supply line to either an internal voltage generator or the other end of the signal line. When a memory is tested, the switch signal generator generates signals so as to make the first switch connect the one of said input pins to the end of the signal line, to make the second switch to connect the data in buffer to the data output circuit, and to make the third switch to connect an internal voltage supply line to the other end of the signal line. Thus, an external voltage can be supplied through one of the data input pins instead of an internal voltage generator, and defective products can be selected out. In an alternative example, the first switch is provided for the data output pins instead of the data input pins.

10 Claims, 6 Drawing Sheets

Fig. 4A $\overline{RAS}$
Fig. 4B $\overline{CAS}$
Fig. 4C $\overline{W}$
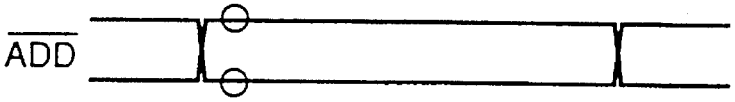
Fig. 4D $\overline{ADD}$
Fig. 4E $\overline{DIN}$
Fig. 4F Vb
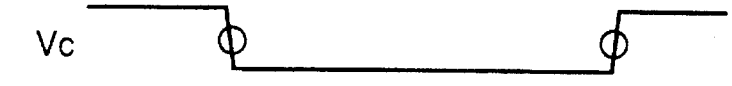
Fig. 4G Vc
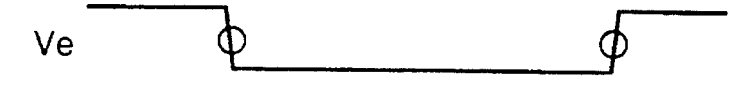
Fig. 4H Ve
Fig. 5A
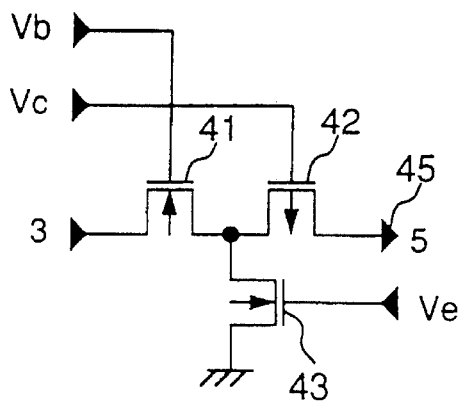
Fig. 5B
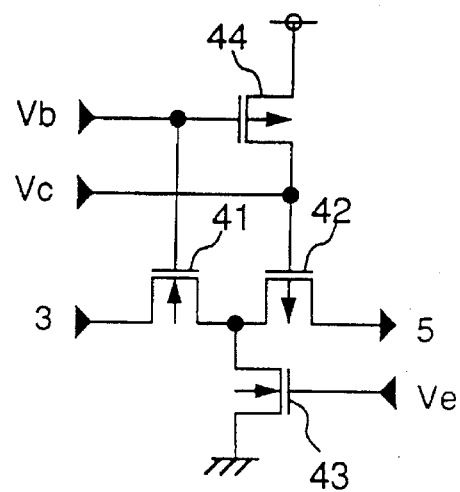

DYNAMIC RANDOM ACCESS MEMORY WITH INTERNAL TESTING SWITCHES

BACKGROUND OF THE INVENTION

1. Field of the Invention

The present invention relates to a dynamic random access memory or in particular to test of dynamic random access memories.

2. Description of the Prior Art

A dynamic random access memory comprises a plurality of circuit portions for processing address, data and control signals as well as a memory cell for storing data. An internal voltage generator generates internal voltages such as a cell plate potential, a precharge voltage for bit lines or a substrate voltage from a power supply voltage applied from the external, and the internal voltages are supplied to operate the dynamic random access memory.

Because internal voltages are generated from the external supply voltage, they change with the power supply voltage. Then, it is desirable that circuit portions receiving internal voltages in a dynamic random access memory operate stably against variation of power supply voltage. However, there are products which are liable to operate abnormally against such variation. It has to be prevented to forward defective products having a narrow operation range dependent on internal voltage. However, defective products may not be checked if input signals are provided to input pins of dynamic random access memories to observe response at output pins.

SUMMARY OF THE INVENTION

An object of the present invention is to provide a dynamic random access memory which can be checked easily if it has a narrow operation range dependent on an internal voltage.

In a dynamic random access memory device according to the present invention, three switches and an internal signal generator therefor are provided besides circuit portions of an ordinary random access memory such as a memory cell, an address input circuit, a data input circuit, a data output circuit and an internal voltage generator. The data input circuit includes data input pins for receiving an input data and data in buffers for storing the input data. The first switch can connect one of data input pins to either one of the data in buffers or an end of a signal line. The second switch can connect data in buffers to a data output circuit. The third switch can connect the internal voltage supply line to either an internal voltage generator or the other end of the signal line. The switch signal generator generates signals so as to make the first switch connect the one of said input pins to the end of the signal line, to make the second switch to connect the data in buffer to the data output circuit, and to make the third switch to connect an internal voltage supply line to the other end of the signal line. Thus, by controlling the three switches, an internal voltage can be supplied through one of the data input pins instead of the internal voltage generator. In an alternative example, the first switch is provided for the data output pins instead of the data input pins.

An advantage of the present invention is that defective products can be checked by providing an internal voltage from the external.

BRIEF DESCRIPTION OF THE DRAWINGS

These and other objects and features of the present invention will become clear from the following description taken with the preferred embodiment thereof in conjunction with reference to the accompanying drawings, and in which:

FIGS. 4A–4H are a timing chart in WCBR mode;

FIGS. 5A and 5B are circuit diagrams of an example of a first switch;

DETAILED DESCRIPTION OF THE PREFERRED EMBODIMENTS

Figure 1:
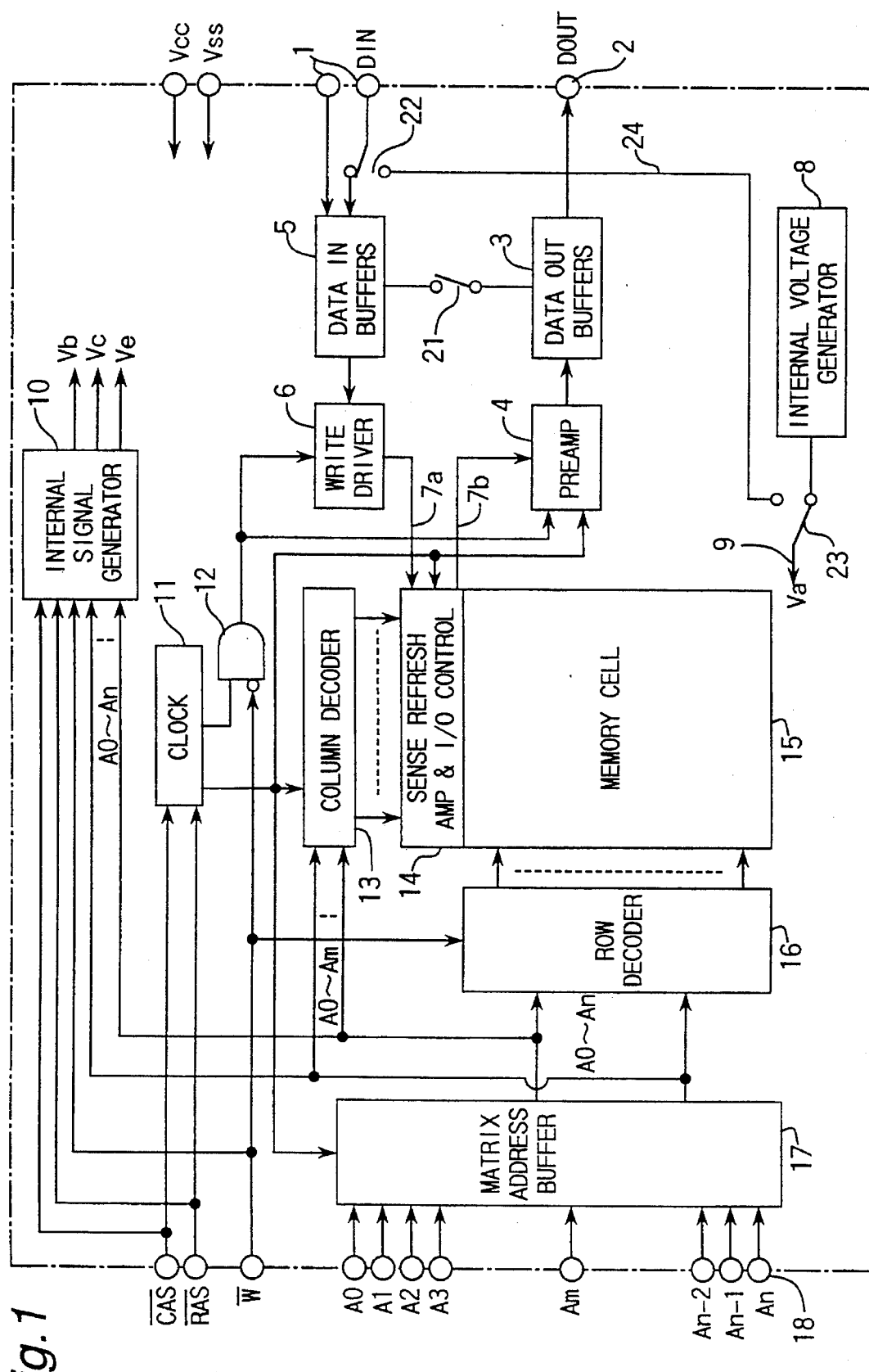
FIG. 1 is a block diagram of a dynamic random access memory.
Figure 2:
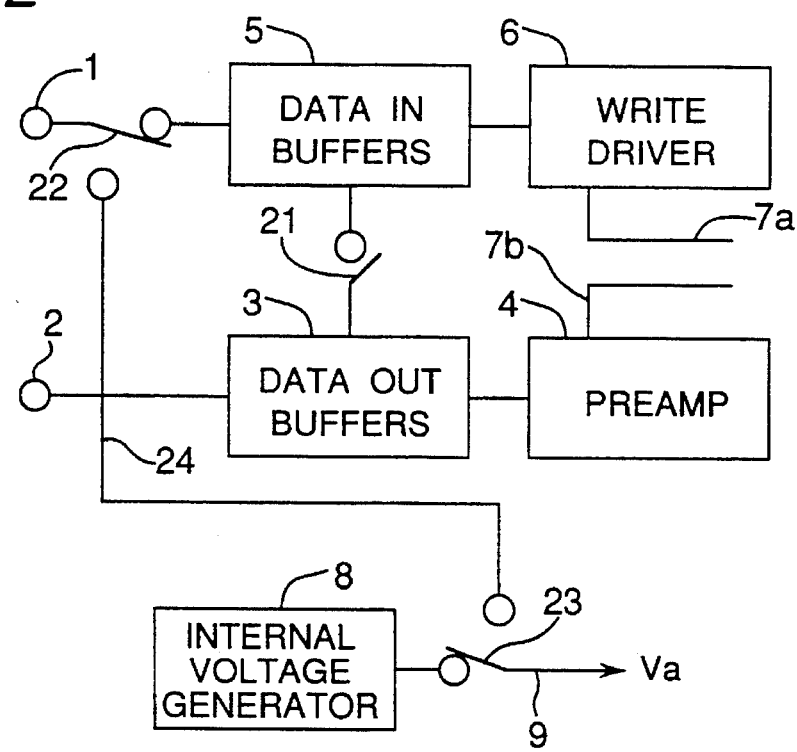
FIG. 2 is a block diagram of a part of the dynamic random access memory.
Figure 3:
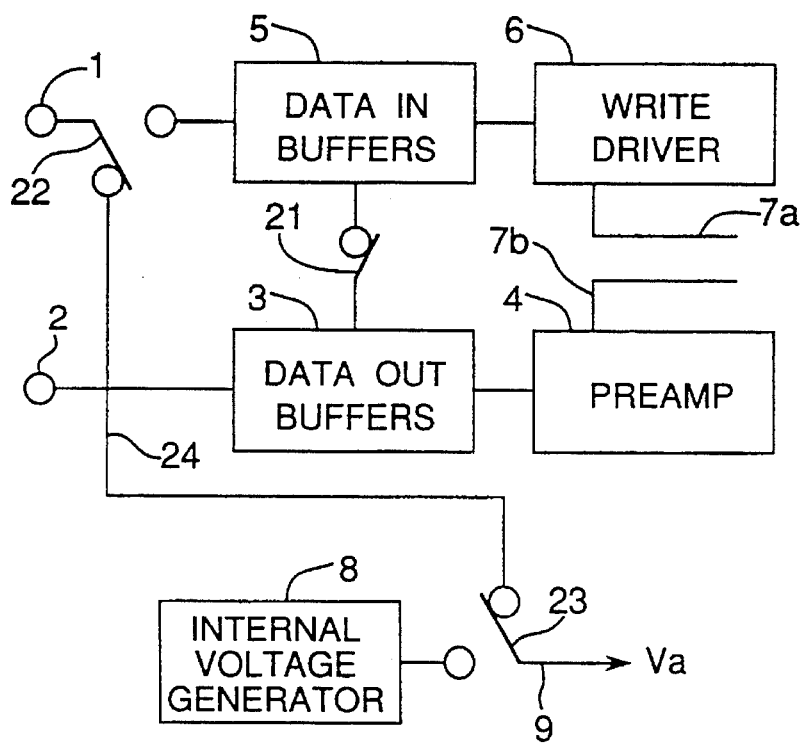
FIG. 3 is a diagram of states of switches when a memory device is checked.

Referring now to the drawings, wherein like reference characters designate like or corresponding parts throughout the several views, FIG. 1 shows an entire structure of a dynamic random access memory, and FIGS. 2 and 3 show only a part thereof with respect to data inputs and outputs. The dynamic random access memory shown in FIG. 1 is similar to a conventional dynamic random access memory except that three switches 21, 22 and 23 and the signal line 24 and an input signal generator 10 therefor are provided.

The dynamic random access memory has address input pins ($A_0$–$A_n$) 18, data input pins (DIN) 1, and data output pins (DOUT) 2. A data received through the data input pins 1 is written to the memory cell 15 at an address designated at the address input pins 18, while a data at an address designated at the address input pins 18 is read from the memory cell 15 through the data output pins 2. An address data $A_0$–$A_n$ is input through the address input pins 18 to a row and column address buffer 17, and the address buffer 17 supplies a row address data $A_0$–$A_n$ to a row decoder 16 and a column address data $A_0$–$A_m$ to a column decoder 13. The row decoder 16 supplies the row address data to the memory cell 15, while the column decoder 13 supplies the column address data to a sense refresh amplifier and input/output control circuit 14 for the memory cell 15. The random access memory receives control signals such as column address strobe $\overline{CAS}$ for latch of a column address and read/write of data, row address strobe $\overline{RAS}$ for latch of a row address, amplification of memory cell data, refreshing and active/precharge operation of the entire memory chip and write control $\overline{W}$ for write/read of a data. The control signals $\overline{CAS}$ and $\overline{RAS}$ are sent to a clock generator 11, which generates clock signals to be sent to the address buffer 17, the row decoder 16, the column decoder 13, the sense refresh amplifier and input/output control circuit 14, and a preamplifier 4. An AND gate 12 receives $\overline{W}$ signal and a clock signal from the clock generator 11 to provide a signal to a write driver 6 and to the preamplifier 4. The write driver 6 writes a data stored in data in buffers 5 through an input/output line 7a to the sense refresh amplifier and input/output control circuit 14. A data stored in the memory cell 15 is sent by the circuit 14 through an input/output line 7b, the preamplifier 4 and the data out buffers 3 to the data output pins 2. The clock signals, read/write of a data at an address designated by an address data and refreshment in W and CAS before RAS (WCBR) mode are not explained further here because they are the same as a conventional dynamic random access memory.

Next, supply of internal voltages is explained. An internal voltage generator 8 generates a prescribed internal voltage Va dependent on a power supply voltage $V_{cc}$ supplied from the external. On the other hand, an internal voltage can also be supplied through the data input pins 1 when a test is performed. The switches 21 connect each of the data in buffers 5 to the counterpart of the data out buffers 3. The switch 22 connects one bit of data input pins 1 to one of the data in buffers 5 or to an end of a signal line 24. The switch 23 connects an internal voltage supply line 9 to the other end of the signal line 24 or to the internal voltage generator 8. The internal signal generator 10 receives control signals $\overline{CAS}$, $\overline{RAS}$ and $\overline{W}$ and an address data $A_0$–$A_m$ and generates switch signals Vb, Vc and Ve for controlling the switches 21, 22 and 23. For example, n=16 and m=8.

In the circuit shown in FIG. 1, it is assumed for the convenience of explanation that only one internal voltage is supplied by the internal voltage generator 8. However, in general, the internal voltage generator 8 generates a plurality of internal voltages. Therefore, a plurality of signal lines 24 and a plurality of internal voltage supply lines 9 are provided in correspondence to the number of the internal voltages to be generated. Therefore, the switches 22 and 23 connect the signal lines 24 to the internal voltage supply lines 9 and to the counterparts of the data input pins 1.

Normally, as shown in FIG. 2, the switches 21 are turned off to isolate the data in buffers 5 from the data out buffers 3. The switch 22 connects the one of the data input pins 1 to the data in buffers 5 and the input data is sent through the pins 1 to the data in buffers 5, while the switch 23 connects the internal voltage generator 8 to the internal voltage supply line 9 and the internal voltage generator 8 supplies the internal voltage. The internal signal generator 10 generates signals Vb, Vc, Ve for such switching to be provided to the switches 21–23.

When a dynamic random access memory is tested, as shown in FIG. 3, the switches 21 are turned on to connect the data in buffers 6 to the data out buffers 3. The switch 22 connects the one of the data input pins 1 to the signal line 24, while the switch 23 connects the signal line 24 to the internal voltage supply line 9. Thus, an internal voltage can be supplied from the one of the data input pins 1 through the signal line 24 to the internal voltage supply line 9. By changing the internal voltage within a specified range for a test, voltage dependence can be observed at the data output pins 2. Thus, it can be checked at all addresses if write and read of a data signal can be operated normally when such test internal voltage is applied. That is, defective dynamic random access memories which operate abnormally under variation of the internal voltage within the specified range can be selected out.

FIG. 4 shows a timing chart. Normally, as shown in FIG. 2, the switch signal Vb is at "L" level, while the switch signals Vc and Ve are at "H" level. Then, the data in buffers 5 are disconnected from the data out buffers 3, while the signal line 24 is isolated from the data input pins 1 and the internal supply line 9. When a test is started, a test circuit (not shown) changes $\overline{W}$ and $\overline{CAS}$ signals from "H" to "L" level just before $\overline{RAS}$ signal from "H" to "L" level. Circles arranged along a vertical line means a same timing. This signal change is called as WCBR mode. When the WCBR is set and an address signal $\overline{ADD}$ is received, the internal signal generator 10 supplies the switch signal Vb at "H" level and the switch signals Vc and Ve are at "L" level to the switches 21, 22 and 23. Thus, the switches 21 are turned on to connect the data in buffers 5 to the data out buffers 3. Further, the switch 22 connects the signal line 24 to the one of the data input pins 1 and the switch 23 connects the signal line 24 to the internal voltage supply line 9. Therefore, an internal voltage can be applied through the data input pins 1 by the test circuit. In this case, a data signal is supplied from the data output pins 2 through the data out buffers 3, the switches 21, the data in buffers 5 and the write driver 6 to the input/output line 7a. The data read from the memory cell 15 is read through the input/output line 7b, the preamplifier 4 and the data out buffers 3 to the data output pins 2.

Next, examples of the switches 21–23 are explained. FIGS. 5A and 5B show an example of the switch 21 when a signal from the data out buffer 3 is positive and negative, respectively. The switch 21 provided between one of the data in buffers 5 and one of the data out buffers 3. In the switch circuit shown in FIGS. 5A and 5B, an N channel field effect transistor (FET) 41 and a P channel FET 42 is connected in series, and another N channel FET 43 is connected between a connection point of the two FETs 41, 42 and the ground. The FETs 41 and 42 are also connected to the data output buffer 5 and to the data input buffer 3, respectively. The internal signal generator 10 supplies the signal Vb to the gate of the FET 41, the signal Vc to the gate of the FET 42 and the signal Ve to the gate of the FET 43. Further, in FIG. 5B, a second P channel FET 44 is connected between the power supply voltage and the gate of the FET 42. The signal Vb is also supplied to the gate of the FET 44. Normally, the signal Vb is set at "L" level, while the signals Vc and Ve are set at "H" level. Therefore, the switch 21 is turned off to isolate the data input buffer 5 from the data output buffer 3. When the test is performed in the WCBR mode and an address $\overline{ADD}$ is given, the signal Vb is set at "H" level, while the signals Vc and Ve are set at "L" level. Then, the switch 21 is turned on.

Figure 6A:
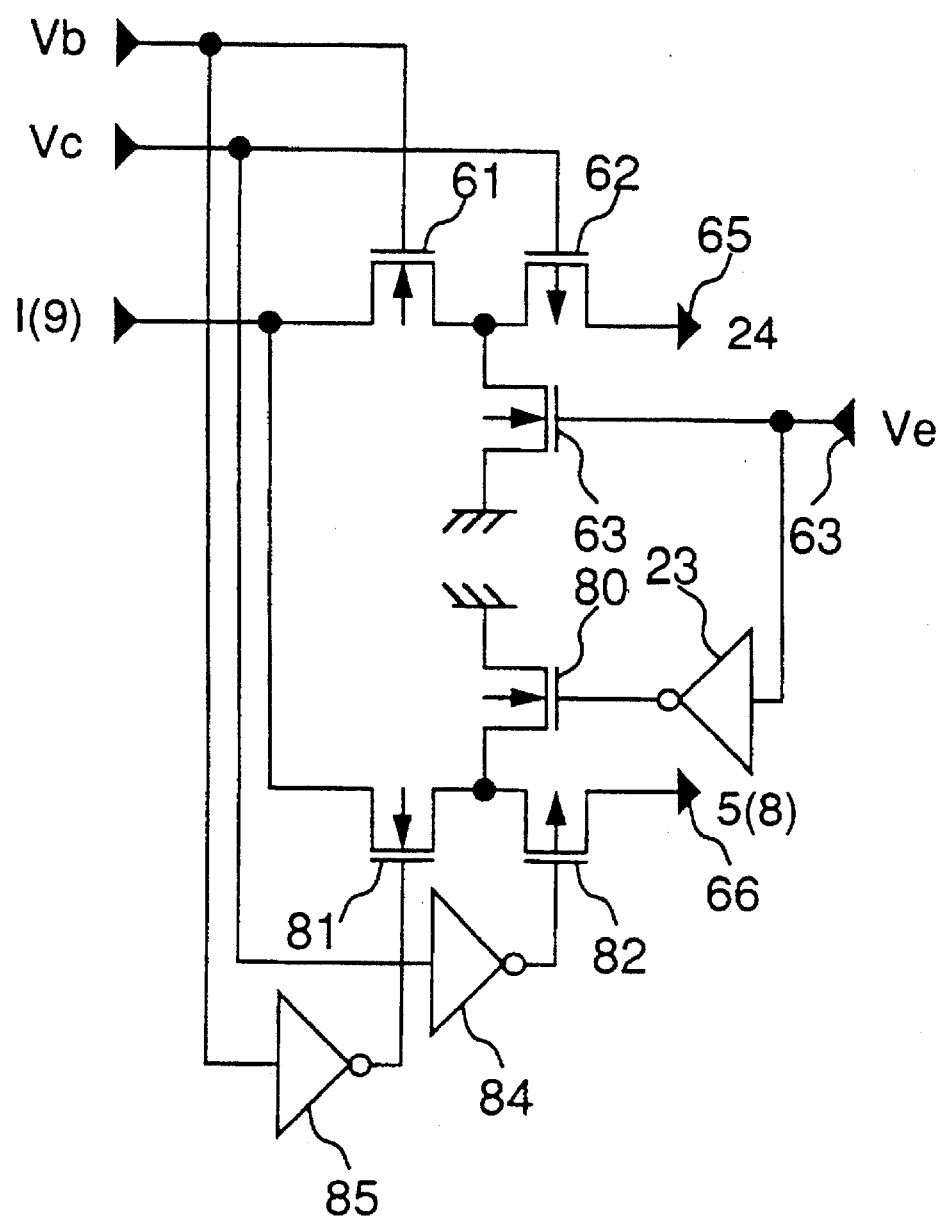
FIGS. 6A and 6B are circuit diagrams of an example of the second and third switches.
Figure 6B:
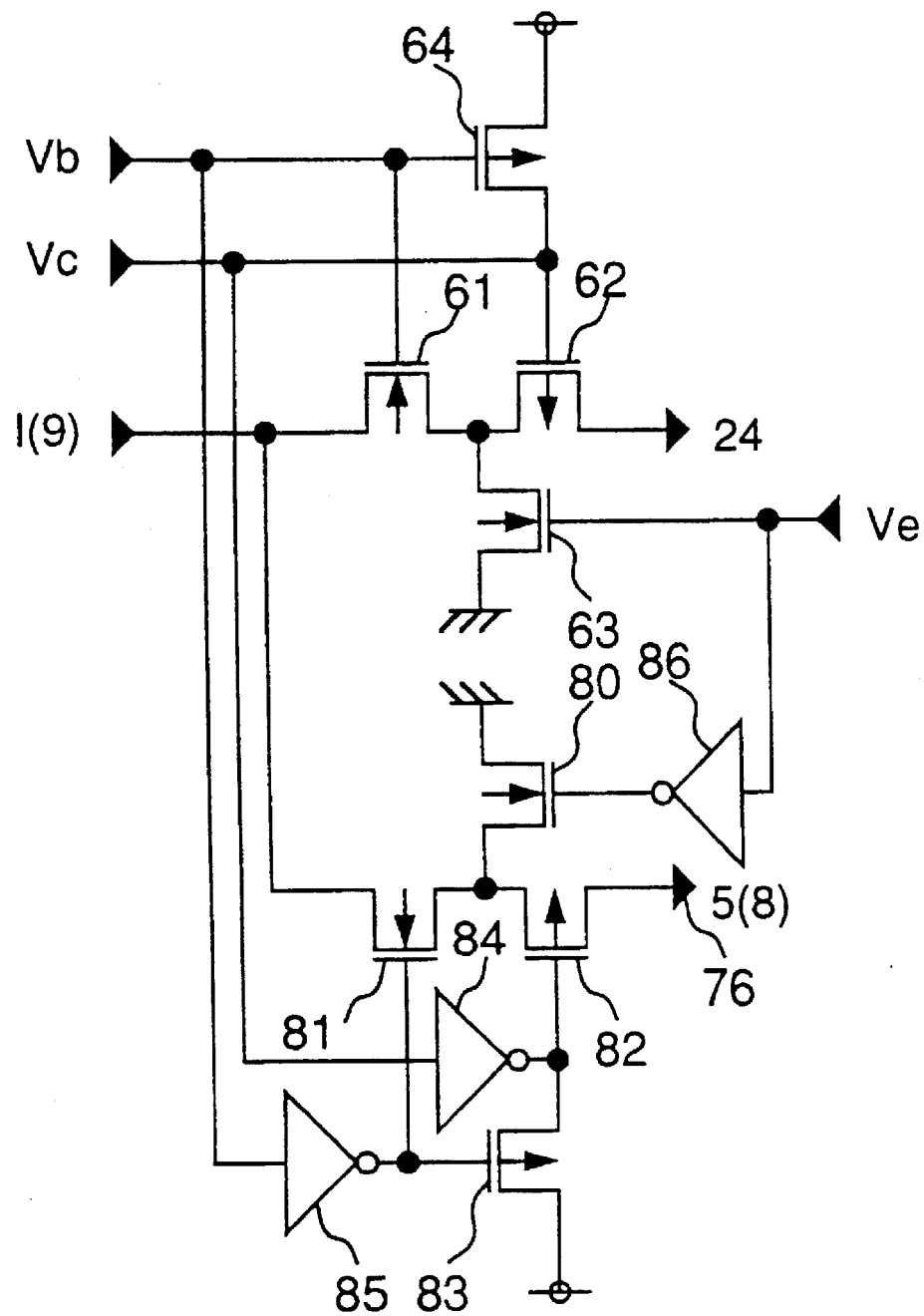

FIGS. 6A and 6B show an example of switch circuits which can be used as the switches 22 and 23 when a signal at the data input pin 1 or the internal voltage supply line 9 is positive and negative, respectively. In the switch circuit shown in FIGS. 6A and 6B, an N channel field effect transistor (FET) 61 and a P channel FET 62 is connected in series, and another N channel FET 63 is connected between a connection point of the two FETs 61, 62 and the ground. The FET 61 is connected to the data input pin 1 (for the switch 22) or to the internal voltage supply line 9 (for the switch 23), while the FET 62 is connected to the signal line 24. The internal signal generator 10 supplies the signal Vb to the gate of the FET 61, the signal Vc to the gate of the FET 62 and the signal Ve to the gate of the FET 63. On the other hand, an N channel field effect transistor (FET) 81 and a P channel FET 82 is connected in series, and another N channel FET 80 is connected between a connection point of the two FETs 81, 82 and the ground. The FET 81 is connected to the data input pin 1 (for the switch 22) or to the internal voltage supply line 9 (for the switch 23) as well as the FET 61, while the FET 82 is connected to the data input buffer 5 (for the switch 22) or to the internal voltage generator 8 (for the switch 23).

The internal signal generator 10 supplies the signal Vb through an inverter 85 to the gate of the FET 81, the signal Vc through an inverter 84 to the gate of the FET 82 and the signal Ve through an inverter 23 to the gate of the FET 80. In FIG. 6B, the P channel FET 64 is connected between the power supply voltage and the gate of the FET 62, and the signal Vb is also supplied to the gate of the FET 64. The other P channel FET 83 is connected between the power supply voltage and the gate of the FET 82, and the signal Vb is also supplied through a inverter 85 to the gate of the FET 83.

Normally, a first portion including the FETs 61–62 is turned off, 63 is turned on and a second portion including the FETs 81–83 is turned on so as to connect the data input pin 1 (for the switch 22) or the internal voltage supply line 9 (for the switch 23) to the data in buffer 5 (for the switch 22) or to the internal voltage generator 8 (for the switch 23). When the test is performed in the WCBR mode, the signal Vb is set at "H" level, while the signals Vc and Ve are set at "L" level. Then, the second portion including the FETs 81–83 is turned off, and the first portion including the FETs 61–62 is turned on and 63 is turned off so as to connect the data input pin 1 (for the switch 22) or the internal voltage supply line 9 (for the switch 23) to the signal line 24. Thus, a data signal as an internal voltage can be supplied through the data output pins 2. That is, the internal voltage can be supplied by a test circuit, without providing extra pins for providing internal voltages.

If a structure of the switch 23 is modified so as to connect the signal line 24 to the internal signal generator 8, it becomes possible to monitor the internal voltages generated by the internal voltage generator 8. Then, the internal voltage generator 8 can be checked.

Figure 7:
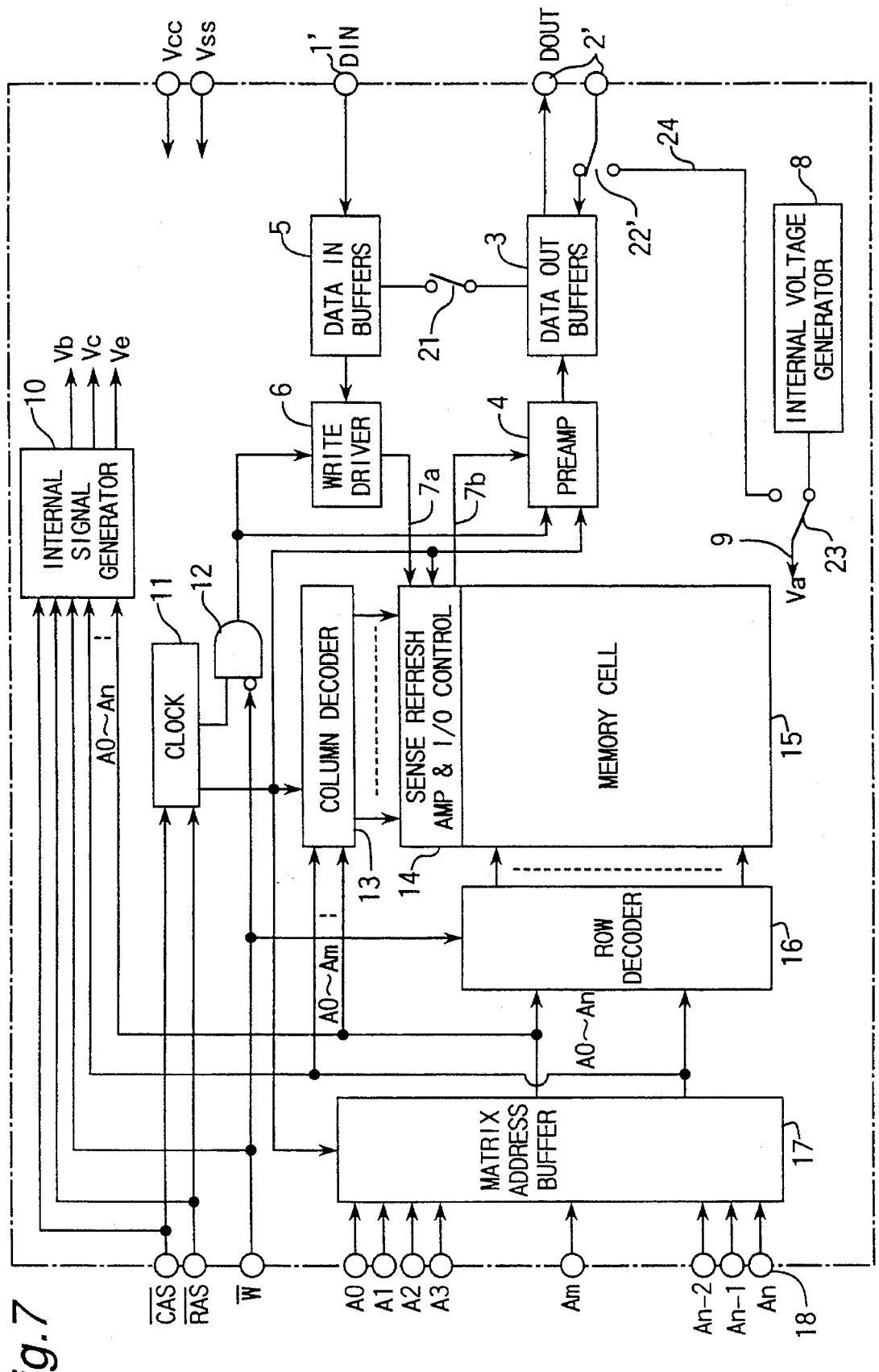
FIG. 7 is a block diagram of a modified embodiment of a dynamic random access memory.

In the above-mentioned circuit shown in FIG. 1, the switch 22 is provided for one of the data input pins 1. However, it will be understood that the switch 22' can also be provided for one of the data output pins 2' alternately. That is, as shown in FIG. 7, the switch 22' is provided to connect one of the data output pins 2' to one of the data out buffers 3 or to the signal line 24. In this case, an internal voltage can be applied through the data output pins 2' in the WCBR mode.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A dynamic random access memory device comprising:

a storage circuit including a memory cell;

an address input circuit for receiving an address for accessing the storage circuit;

a data input circuit connected to said storage circuit, said data input circuit including data input pins for receiving an input data and data buffers for storing the input data;

a data output circuit connected to said storage circuit;

an internal voltage generator for generating a prescribed internal voltage from a power supply voltage;

an internal voltage supply line connected to said internal voltage generator so as to supply the prescribed internal voltage generated by said internal voltage generator;

a first switch to connect one of said data input pins to either one of said data in buffers or an end of a signal line;

a second switch to connect said data in buffers to said data output circuit;

a third switch to connect said internal voltage supply line to either said internal voltage generator or the other end of said signal line; and a switch signal generator for generating control signals for said switches during a test mode, so as to make said first switch connect said one of said input pins to the end of said signal line, to make said second switch to connect said data in buffer to said data output circuit, and to make said third switch to connect said internal voltage supply line to the other end of said signal line.

2. The dynamic random access memory device according to claim 1, wherein said data output circuit includes data out buffers for storing an output data and data output pins for sending the output data, and said second switch can connect said data in buffers to said data out buffers.

3. The dynamic random access memory device according to claim 1, wherein said internal voltage is a substrate potential.

4. The dynamic random access memory device according to claim 1, wherein said internal voltage is a cell plate voltage.

5. The dynamic random access memory device according to claim 1, wherein said switch signal generator receives column address strobe input, row address strobe input and write control input and generates the signals in WCBR mode.

6. A dynamic random access memory device comprising:

a storage circuit including a memory cell;

an address input circuit for receiving an address for accessing the storage circuit;

a data input circuit connected to said storage circuit;

a data output circuit connected to said storage circuit, said data output circuit including data output pins for providing an output data and data buffers for storing the input data;

an internal voltage generator for generating a prescribed internal voltage from a power supply voltage;

an internal voltage supply line connected to said internal voltage generator so as to supply the prescribed internal voltage generated by said internal voltage generator;

a first switch to connect one of said data output pins to either one of said data buffers or an end of a signal line;

a second switch to connect said data buffers to said data input circuit;

a third switch to connect said internal voltage supply line to either said internal voltage generator or the other end of said signal line; and a switch signal generator for generating control signals for said switches during a test mode, so as to make said first switch connect said one of said input pins to the end of said signal line, to make said second switch to connect said data buffer to said data input circuit, and to make said third switch to connect said internal voltage supply line to the other end of said signal line.

7. The dynamic random access memory device according to claim 6, wherein said data input circuit includes data in buffers for storing an input data and data input pins for receiving the input data, and said second switch can connect said data in buffers to said data buffers.

8. The dynamic random access memory device according to claim 6, wherein said internal voltage is a substrate potential.

9. The dynamic random access memory device according to claim 6, wherein said internal voltage is a cell plate voltage.

10. The dynamic random access memory device according to claim 6, wherein said switch signal generator receives column address strobe input, row address strobe input and write control input and generates the signals in WCBR mode.

* * * * *